(12) United States Patent
Kitazaki (10) Patent No.: US 6,385,090 B1
(45) Date of Patent: May 7, 2002

(54) SEMICONDUCTOR NONVOLATILE MEMORY USING FLOATING GATE

(75) Inventor: Kazuhiro Kitazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/883,377

(22) Filed: Jun. 19, 2001

(30) Foreign Application Priority Data

Feb. 26, 2001 (JP) ........................................ 2001-050765

(51) Int. Cl.[7] .............................................. G11C 16/04
(52) U.S. Cl. .............................. 365/185.18; 365/185.29
(58) Field of Search ........................ 365/185.18, 185.2, 365/185.21, 185.22, 185.27, 185.29

(56) References Cited

U.S. PATENT DOCUMENTS 5,537,358 A * 7/1996 Fong ...................... 365/185.29
6,249,459 B1 * 6/2001 Chen et al. ............. 365/185.29

FOREIGN PATENT DOCUMENTS

JP          8-273378          10/1996

* cited by examiner

Primary Examiner—Trong Phan
(74) Attorney, Agent, or Firm—Arent Fox Kintner Plotkin & Kahn, PLLC (57) ABSTRACT

The present invention provides a semiconductor nonvolatile memory provided with a plurality of memory cells having floating gates, which enables an optimum erase operation, even when the erase rate fluctuates due to production irregularities, by monitoring the state of a memory cell during erase process and controlling the erase voltage applied to a control gate in accordance with the state of erase progress. As a specific example of the state of a memory cell, which is monitored during erase process, leakage current of a memory cell during erase process is monitored.

9 Claims, 6 Drawing Sheets

FIG.1A
PRIOR ART

DATA "0"
ERASE STATE

FIG.1B
PRIOR ART

DATA "1"
PROGRAM STATE

In case of slow erase operation

FIG. 6

In case of fast erase operation

SEMICONDUCTOR NONVOLATILE MEMORY USING FLOATING GATE

BACKGROUND OF THE INVENTION

1. Field of the Invention

The present invention relates to semiconductor nonvolatile memory, which utilizes floating gates, and more particularly to semiconductor nonvolatile memory, which eliminates delay in erase operation and reduces stress on a tunnel dielectric layer.

2. Description of the Related Art

A semiconductor nonvolatile memory, which makes use of floating gates, is electrically rewritable, can retain data even in the power OFF state, and is widely used as flash memory.

Figure 1A:
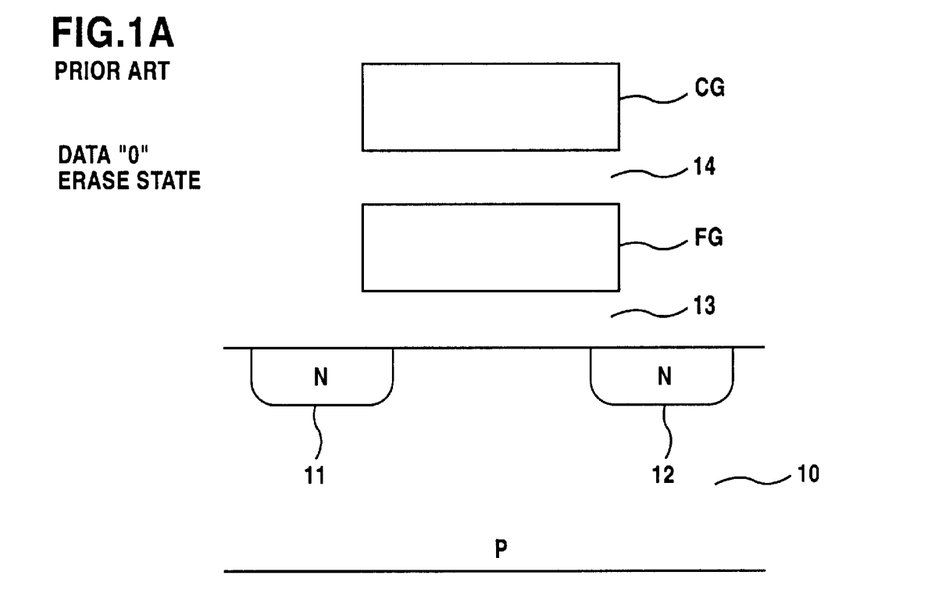
FIGS. 1A–1B are diagrams showing a cell structure of a conventional semiconductor nonvolatile memory.
Figure 1B:
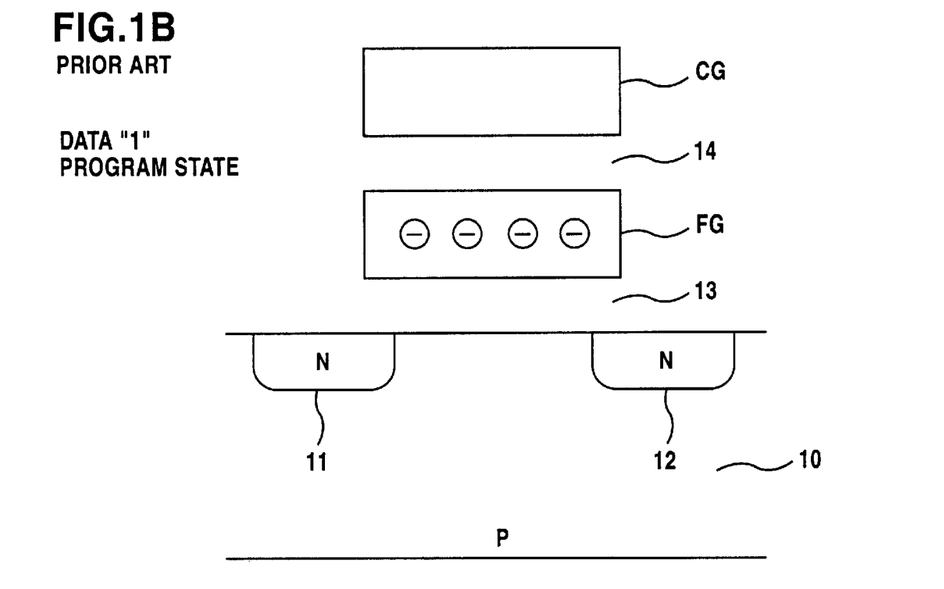

FIG. 1 is a diagram showing the cell structure of a conventional semiconductor nonvolatile memory. FIG. 1A is an erase state, in which data "0" is stored. FIG. 1B is a programmed state (written state), in which data "1" is stored. As for the cell structure, an n-type source region 11 and drain region 12 are formed at the surface of a p-type semiconductor substrate 10, a floating gate FG is formed via a tunnel dielectric layer (normally an oxide layer) above the channel region therebetween, and, in addition, a control gate CG is formed via a dielectric layer thereabove.

When a charge, such as electrons, is not stored in a floating gate FG, it is an erased state, in which the threshold voltage of a cell transistor is low, and data "0" is stored. In this state, when a prescribed read-out voltage is applied to the control gate CG, the cell transistor conducts. Conversely, when a charge, such as electrons, is stored in the floating gate FG, it is a programmed state, in which the threshold voltage of a cell transistor is high, and data "1" is stored. In this state, even if a read-out voltage is applied to the control gate CG, the cell transistor does not conduct. Data determination is performed in accordance with a cell current, which is generated by the conduction and non-conduction of the cell transistor. Furthermore, for the sake of brevity, examples will be explained hereinbelow using electrons as the charge stored on a floating gate.

The writing (programming) and erasing of data are performed by injecting and extracting electrons into and from a floating gate FG via a tunnel dielectric layer 13. In a write operation (programming operation), for a cell in an erased state, hot electrons are generated in the channel region by applying 10 V, for example, to the control gate CG, 5 V, for example, to the drain 12, and 0 V, for example, to the source 11, and the hot electrons thereof are injected into the floating gate FG by an electric field resulting from the positive voltage applied to the control gate CG. Determining whether or not write is complete is performed by applying a prescribed program verify voltage to the control gate, and checking cell current in accordance with the conduction, non-conduction of the cell transistor.

In an erase operation, for a cell in a programmed state, −10 V, for example, is applied to the control gate CG, the drain 12 is set to the floating state, and 5 V, for example, is applied to the source 11 as well. In accordance therewith, a high electric field is generated in the tunnel dielectric layer 13, and electrons in the floating gate FG tunnel through the tunnel dielectric layer 13 by the FN (Fowler-Nordheim) tunneling effect, and are extracted to the source 11. Determining whether or not erase is complete is-performed by applying a prescribed erase verify voltage to the control gate, and checking cell current in accordance with the conduction, non-conduction of the cell transistor.

An erase operation is generally not performed in memory cell units, but rather, is performed collectively in either block units or chip units comprising a plurality of memory cells. Thus, in an erase operation, all cells are initially set to the written state (programmed state). Thereafter, the above-mentioned erase operation is performed for all memory cells. Further, an erase operation is performed while carrying out erase verify each time an erase pulse is applied.

A read-out operation is performed by applying 5 V, for example, to the control gate of a selected memory cell, 1 V, for example, to the drain, and 0 V, for example, to the source, and checking the conduction/non-conduction of the cell transistor. As for the voltage applied to the control gate, an intermediate value of the threshold voltages of the erased state and programmed state (written state) is selected.

In the above-mentioned erase operation, a large number of electrons remain on a floating gate at the start of erase operation. Therefore, when −10 V is applied to the control gate, the potential resulting from the electrons on the floating gate is increased, and an excessive electric field is applied to the tunnel dielectric layer 13. When the electric field across the tunnel dielectric layer 13 is high, tunnel current becomes larger, and erase time becomes shorter, but a high electric field places excessive stress on a tunnel dielectric layer, causing damage and bringing about degradation or destruction. Therefore, there is a limit for high electric field to be placed on a tunnel dielectric layer.

Accordingly, in the past, there was proposed a variable erase voltage system, in which the voltage applied to a control gate during an erase operation is set low at the initial stage of erase, and is increased in line with the progress of the erase operation. According to this system, for example, a voltage of approximately −6 V is applied to the control gate at the start of erase operation, and as erasure progresses, the control gate voltage is lowered to −10 V. In this manner, the electric field being applied to the tunnel dielectric layer can be maintained constant to a certain degree, making it possible to prevent the applying of an excessive electric field to the tunnel dielectric layer, and to curb the degradation or destruction of the tunnel dielectric layer.

However, a conventional variable erase voltage system uniformly changes the erase voltage applied between a control gate and a substrate in accordance with erase time, or more specifically, with the number of erase pulses. For example, at the stage of designing a memory, an optimum erase voltage rise curve is determined for a number of erase pulses, and the erase voltage rise curve thereof is applied to all memory devices. As a result thereof, when erase speed differs from the design value due to production irregularities, either the electric field applied to the tunnel dielectric layer is too low and erase time becomes prolonged, or the applied electric field is too high and causes the degradation of the tunnel dielectric layer.

For example, as a typical example of a production irregularity, there is the variation in the thickness of a tunnel dielectric layer. When a tunnel dielectric layer becomes thick, the erase speed for the same control gate voltage slows down. In the case thereof, until the erase voltage is increased after a certain amount of erase time has elapsed, and, consequently, the electric field applied to the tunnel dielectric layer becomes higher, not much erasing is done, and actual erase time becomes longer than the set erase time.

By contrast, when a tunnel dielectric layer becomes thin, the erase speed for the same control gate voltage increases. In this case, because an excessive electric field is continuously applied to the tunnel dielectric layer, the degradation of the tunnel dielectric layer occurs. In particular, when the erase voltage is uniformly raised in accordance with erase time, such an excessive electric field becomes even more prominent.

SUMMARY OF THE INVENTION

Accordingly, an object of the present invention is to provide an optimum variable erase voltage system for a memory for which erase speed fluctuates in accordance with production irregularities.

Further, another object of the present invention is to provide a semiconductor nonvolatile memory for optimally controlling changes in erase voltage corresponding to changes in erase speed resulting from production irregularities.

To achieve the above-mentioned objects, the present invention provides a semiconductor nonvolatile memory provided with a plurality of memory cells having floating gates, which enables an optimum erase operation, even when the erase rate fluctuates due to production irregularities, by monitoring the state of a memory cell during erase process and controlling the erase voltage applied to a control gate in accordance with the state of erase progress. As a specific example of the state of a memory cell, which is monitored during erase process, leakage current of a memory cell during erase process is monitored.

For example, a portion or all of the memory cells being erased are selected, and the drain current (cell leakage current hereinbelow) is checked when a prescribed voltage is applied to the control gates. In a state where erase is not being adequately performed due to numerous electrons remaining on a floating gate, the cell leakage current is small. Conversely, because the electrons on a floating gate decrease in line with erase progress, the cell leakage current becomes large. Therefore, when the cell leakage current is small, since a large number of electrons remain on a floating gate, the erase voltage applied to a cell is reduced to suppress the electric field of a tunnel dielectric layer. By contrast, when the cell leakage current is large, since a small number of electrons remain on a floating gate, the erase voltage is increased so as to make it possible to achieve highspeed erase. An excessive electric field is not generated inside a tunnel dielectric layer even if the erase voltage is increased.

According to the above-mentioned invention, because the erase progress state of a cell is detected via cell leakage current, and erase voltage is controlled to be changed from a low level to a high level in accordance therewith, therefore, even if the erase speed fluctuates due to production irregularities, it is possible to prevent the prolonging of erase time, while avoiding the application of an excessive electric field to a tunnel dielectric layer, making it possible to guarantee an optimum erase operation.

To achieve the above-mentioned objects, a first aspect of the present invention is a semiconductor nonvolatile memory, comprising a plurality of memory cells, which are provided with floating gates above a semiconductor substrate with a tunnel dielectric layer interposed therebetween, and which also have control gates; and an erase control circuit which detects cell leakage current by applying a leakage detecting voltage to the control gate of a memory cell to be erased, and gradually increases an erase voltage applied between the control gate and the semiconductor substrate in accordance with the detected cell leakage current.

In the first aspect of the above-mentioned invention, for a first embodiment, the erase control circuit controls the erase voltage to a first voltage when the cell leakage current is a first leakage current, and controls the erase voltage to a second voltage larger than the first voltage, when the cell leakage current is a second leakage current larger than the first leakage current.

Furthermore, in the first aspect of the above-mentioned invention, for another embodiment, when the cell leakage current is lower than a reference value which rises in accordance with erase time, the erase control circuit induces the erase voltage higher in accordance with the erase time, and when the cell leakage current is higher than the reference value, induces the erase voltage lower in accordance with the erase time.

To achieve the above-mentioned objects, a second aspect of the present invention is a semiconductor nonvolatile memory, comprising a plurality of memory cells, which are provided with floating gates above a semiconductor substrate with a tunnel dielectric layer interposed therebetween, and which also have control gates; and an erase control circuit which detects cell leakage current by applying a leakage detecting voltage to the control gate of a memory cell to be erased, and controls a rise rate relative to erase time of an erase voltage applied between the control gate and semiconductor substrate in accordance with a change rate relative to the erase time of the detected cell leakage current.

DESCRIPTION OF THE PREFERRED EMBODIMENTS

The aspects of the embodiment of the present invention will be explained hereinbelow by referring to the figures. However, such aspects of the embodiment do not limit the technical scope of the present invention, the technical scope of the present invention extending to the claims and equivalents thereof.

Figure 2:
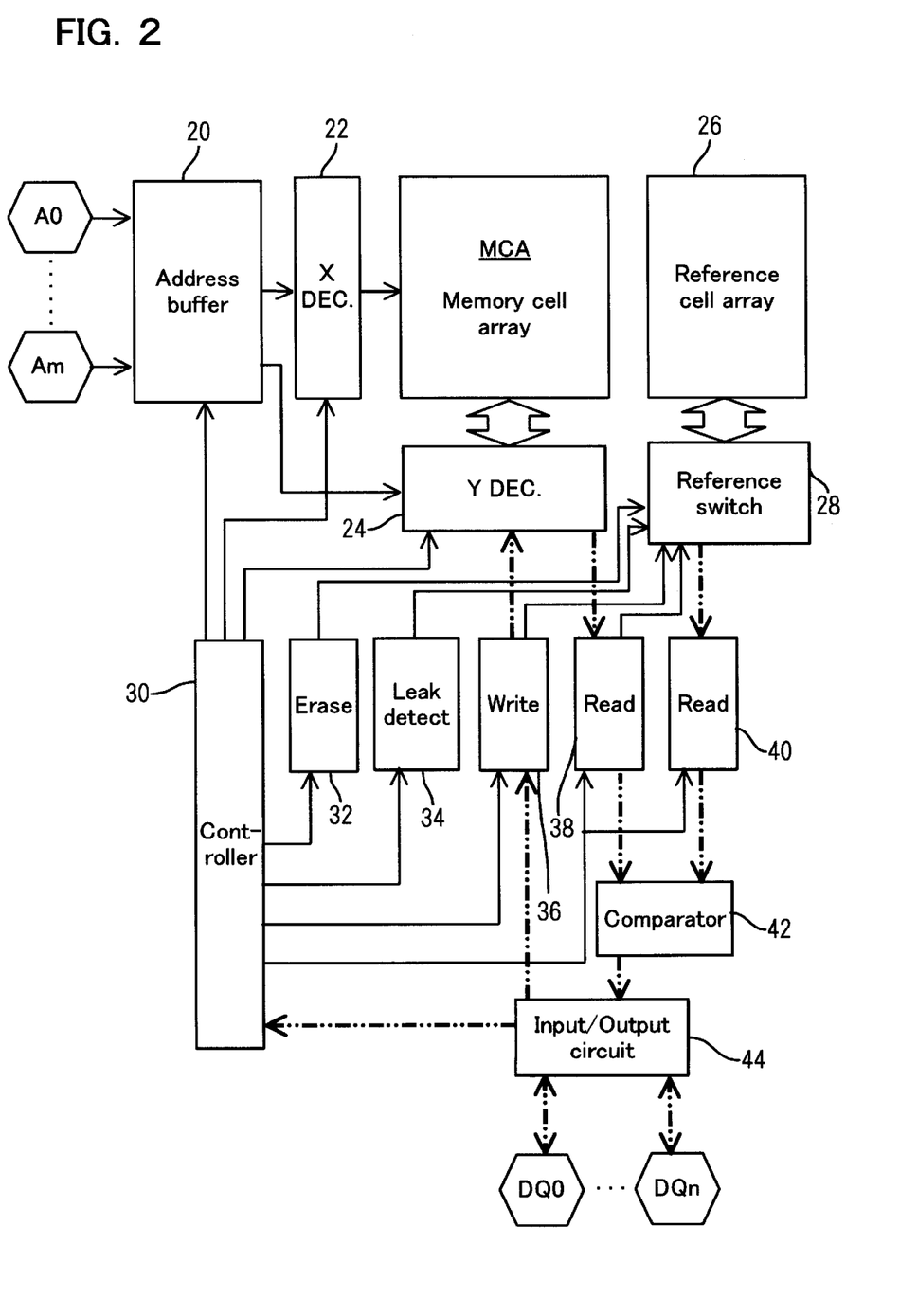
FIG. 2 is a block diagram of a semiconductor nonvolatile memory of this aspect of the embodiment.

FIG. 2 is a block diagram of a semiconductor nonvolatile memory of the embodiment. As shown in FIG. 2, an X decoder 22 and a Y decoder 24 are provided for a memory cell array MCA. Address signals A0–Am from outside are supplied to the X, Y decoders 22, 24 via an address buffer 20. In addition to a memory cell array MCA, there is provided a reference cell array 26 having a plurality of reference cells of the same constitution as the memory cells of the memory cell array. This reference cell array 26, as will be explained hereinbelow, comprises, for example, a reference cell for read-out, a reference cell for write (programming) verify, a reference cell for erase verify, and a reference cell for leakage current detection.

Data input/output terminals DQ0–DQn are connected to an input/output circuit 44, and write data is supplied to a write circuit 36 during write time, and read-out data is supplied to the input/output circuit 44 via a comparator 42 during read-out time.

A semiconductor nonvolatile memory executes read-out operations, write operations (programming operations) and erase operations. In the operations thereof, it is necessary to apply a different voltage to the control gate, drain, and source of a memory cell as explained hereinabove. Thus, a semiconductor nonvolatile memory has a control circuit 30, and an erase circuit 32, write circuit 36, read-out circuits 38, 40 and comparator circuit 42 controlled by the control circuit 30. Furthermore, a leakage detecting circuit 34 is provided for detecting the leakage current of a cell during an erase operation.

More specifically, during a write operation, the control circuit 30 sends a write operation command to the write circuit 36, and in r response thereto, the write circuit 36 applies voltages for writing to the control gate, drain, and source of a memory cell, and injects electrons onto the floating gate. Then, the write circuit 36 provides a selection signal to a reference switching circuit 28 for selecting a reference cell for write verify, and performs write verify. Further, during read-out, the control circuit 30 sends a read-out operation command to the read-out circuit 38, and in response thereto, a selection signal for selecting a reference cell for read-out is provided to the reference switching circuit 28, and a read-out operation is performed.

Furthermore, during an erase operation, the control circuit 30 supplies an erase operation command to the erase circuit 32, and in response thereto, the erase circuit 32 applies voltages for erasure to the control gate, drain, and source of a memory cell, extracts electrons from the floating gate, provides a selection signal for selecting a reference cell for erase verify, and performs erase verify.

The memory cell array MCA includes a plurality of memory blocks each of which includes a plurality of memory cells. The erase operation is performed collectively for each memory block.

Figure 3:
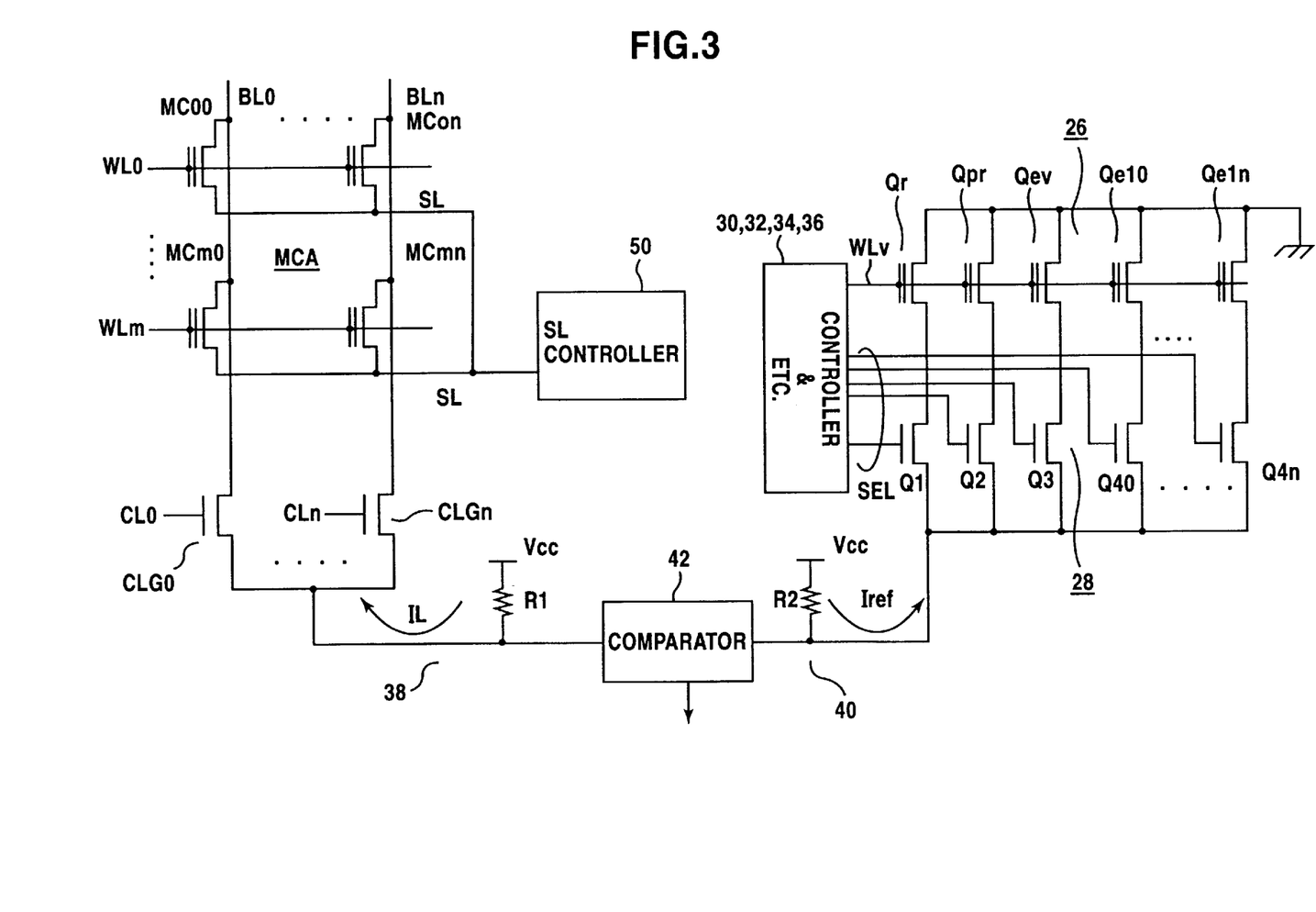
FIG. 3 is a diagram showing detailed examples of a reference cell and a reference switching circuit.

FIG. 3 is a diagram showing detailed examples of a reference cell and reference switching circuit. In FIG. 3, a memory cell array MCA, which has memory cells MC00–MCmn of m+1 rows, n+1 columns arranged at the intersections of word lines WL0–WLm and bit lines BL0–BLn, is shown. A word line WL is connected to the control gate of a memory cell MC, and is driven at each operation voltage by a word line driving circuit inside the X decoder of FIG. 2. Further, the drain of a memory cell is connected to each bit line BL, and furthermore, the source of a memory cell is connected to a source line SL, which is controlled by source line control circuit 50. The bit lines BL of a memory cell array MCA are connected to a resistor R1 for detecting cell current via column gates CLG0–CLGn. The conduction/nonconduction of the respective column gates CLG0–CLGn is controlled by column selection signals CL0–CLn generated by the Y decoder 24. And the resistor R1 corresponds to one part of read-out circuit 38.

Meanwhile, the reference cell array 26 has, for example, a read-out reference cell Qr, a write verify reference cell Qpr, and an erase verify reference cell Qev. And then, the reference cell array 26 is connected to a resistor R2 for detecting reference cell current via switching transistors Q1–Q3 of reference switching circuit 28. This resistor R2 corresponds to one part of read-out circuit 40.

Furthermore, the reference cell array 26 has leakage detection reference cells Qe10–Qe1n for detecting the leakage current of a memory cell at erase process. For example, when the erase voltage applied between a control gate and the substrate at erase process is controlled while being steadily raised in 32 steps, either 32 or 31 such leakage detection reference cells are provided.

In FIG. 3, the control circuit 30, erase circuit 32, leakage detecting circuit 34, and write circuit 36 control the word line WLr of the reference cell array 26, and the selection signal SEL to the reference switching circuit 28.

In this aspect of the embodiment, for a write operation, a write pulse is applied to a selected memory cell inside the memory array the same as in a conventional example. Thereafter, a prescribed voltage is applied to the word line of this memory cell and the word line WLr of the reference cell array 26, and transistor Q2 of the reference switching circuit 28 is selected. Then, a voltage drop resulting from current Iref flowing to resistor R2 from the write verify reference cell Qpv, and a voltage drop resulting from cell current IL flowing to resistor R1 from the memory cell are compared by the comparator 42, and program verify (write verify), which determines whether or not write has been completed, is performed.

For a read-out operation, a prescribed voltage for read-out is applied to a selected memory cell inside the memory array and the word line WLr inside the reference cell array the same as in a conventional example, transistor Q1 of the reference switching circuit 28 is selected, and, in the same manner as explained hereinabove, cell current IL of the memory cell and current Iref of reference cell Qr are compared, and data is read out.

For an erase operation, an erase pulse is applied to a memory cell inside a block comprising a plurality of memory cells. This erase pulse is applied to a word line WL in a state in which the drain of the memory cell is set to a floating state, and the source is set at +5 V. The voltage of an erase pulse complies with the variable erase voltage system, and at the beginning of an erase operation, the absolute value is controlled low to around −6 V, for example, and as erase time elapses, that is, as the number of erase pulses increases, the absolute value steadily rises, constituting around −10 V. In accordance therewith, by considering the amount of electrons on the floating gate, an excessive electric field is not applied to the tunnel dielectric layer 13 of the cell.

Then, each time an erase pulse is applied, an erase verify reference cell Qev of the reference cell array is selected, a prescribed voltage is applied to the memory cell MC word line WL and the reference cell array 26 word line WLr, the cell current IL of the memory cell and the reference leakage current Iref of reference cell Qev are compared, and erase verify is performed. The erase verify reference cell Qev has the same cell structure as a memory cell inside the cell array, and electrons of an amount corresponding to erase verify are injected beforehand onto the floating gate thereof. Therefore, by applying an erase pulse, the electrons on the floating gate of the memory cell are drawn out, and the fact that the quantity of electrons thereof is less than the quantity of electrons on the floating gate of the erase verify reference cell Qev is confirmed by comparing the respective cell currents IL and reference leakage currents Iref.

In the embodiment, in an erase operation, the erase pulse voltage is controlled variably in accordance with the cell leakage current of the memory cell being erased. Thus, it is necessary to detect what level the cell leakage current of the memory cell being erased is at. To apply a prescribed voltage to a memory cell word line WL and detect cell leakage current flowing to a drain, the leakage current detection reference cell group Qe10–Qe1n inside the reference cell array is used.

In a leakage detection operation during an erase operation, a prescribed positive voltage is applied by the leakage detection circuit 34 via the X decoder 22 to either a portion or all of the word lines WL of the memory cell being erased. The prescribed positive voltage thereof is determined so that the memory cell being erased barely leaks a drain current, and such voltage is around 4 V, for example. Furthermore, the Y decoder is made to select either a portion or all of the bit lines by the leakage detection circuit 34. Then, the leakage detection circuit 34 consecutively selects leakage detection reference cell section transistors Q40–Q4n via selection signals SEL, compares cell leakage current IL from a memory cell and reference leakage current Iref, and detects what level the cell leakage current IL is at.

Therefore, the leakage detection reference cells are set such that the quantity of electrons on the respective floating gates differs stepwise, and the reference leakage current Iref differs stepwise. Therefore, by comparing the voltage drop of the resistors R1, R2 by the cell leakage current IL and the reference leakage current Iref according to the comparator 42, it is possible to detect what level the cell leakage current is at.

By detecting the cell leakage current value of a memory cell being erased in this manner, it is possible to indirectly detect the quantity of electrons on the floating gate of the memory cell. Therefore, it is possible to gradually change the erase pulse voltage from –6 V to –10 V in accordance with the cell leakage current thereof, i.e., the quantity of electrons on the floating gate. The controlled erase pulse voltage, for example, is variably controlled in 32 steps from –6 V to –10 V. And then, so that the detected cell leakage current value coincides with a reference leakage current value, control is performed so as to increase the erase pulse voltage when the cell leakage current value is smaller than the reference leakage current value, and to decrease the erase pulse voltage when the cell leakage current value is larger than the reference leakage current value. However, overall the erase pulse voltage is controlled so as to successively change from –6 V to –10 V.

When the erase operation is performed collectively for memory block, a total leakage current value of all memory cells in the memory block is detected.

Figure 4:
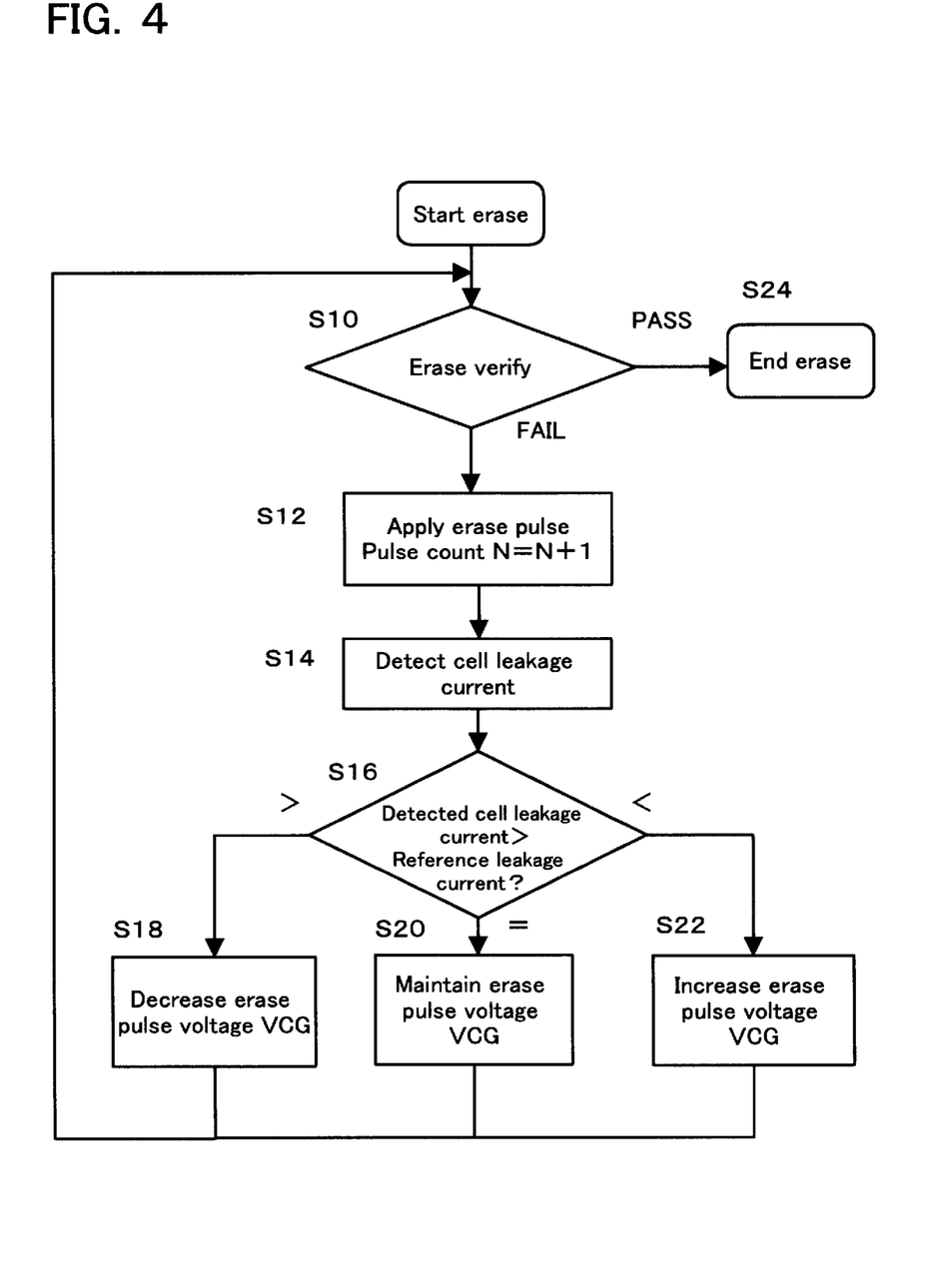
FIG. 4 is a flowchart of an erase operation.

FIG. 4 is a flowchart of an erase operation. As a precondition, all cells to be erased are set to the programmed state prior to commencing the erase operation of FIG. 4. Hereinbelow, an explanation is given according to the flowchart. First, an erase verify is performed (S10). For erase verify, as explained hereinabove, whether or not the electrons on the floating gate of a memory cell to be erased have been sufficiently extracted is detected in accordance with whether or not the cell current exceeds the reference current of an erase verify reference cell when a prescribed positive voltage is applied to the word line. This is because, if sufficient electrons have been extracted, the threshold voltage of the cell transistor decreases sufficiently, and the cell current becomes larger than the reference current.

Ordinarily, it is not possible to pass erase verify in the first stage of an erase operation. Accordingly, an erase pulse is applied to a block having the memory cells to be erased (S12). More specifically, memory cell drains are set to a floating state, source lines are set to +5 V, and a –6 V erase pulse is applied to word lines WL. Then, the number N of erase pulses is incremented by 1 to count that erase pulse.

Next, the leakage current of the cells to be erased is detected (S14). More specifically, as explained hereinabove, around a +4 V is applied to either a portion or all of the word lines of cells to be erased, and similarly, around a +4 V is also applied to the word lines of the reference cells. Then, transfer gates Q40–Q4n of the reference switching circuit are sequentially selected, cell leakage currents IL leaking from the drains of the memory cells are sequentially compared with reference leakage currents Iref from the reference cells Qe10–Qe1n, and the level of cell leakage current is detected.

When the detected cell leakage current is lower than a reference leakage current corresponding to the erase pulse count, this signifies that the memory cell erase speed is slow, and that the electrons on the floating gates are not being extracted at the predetermined level. Therefore, control is performed so as to increase erase speed by increasing the erase pulse voltage higher than the predetermined level (S22).

When the detected cell leakage current is higher than the reference leakage current, this signifies that the memory cell erase speed is fast, and that the extraction of electrons on the floating gates is being performed beyond the predetermined level. Therefore, in this case, to alleviate the state in which an excessive electric field is being applied to the tunnel dielectric layer, control is performed so as to either lower the erase pulse voltage, or to curb the rise of the erase pulse voltage (S18).

If the detected cell leakage current is equivalent to the reference leakage current, the erase pulse voltage is maintained at the predetermined level (S20).

The above-mentioned erase verify S10, erase pulse application S12, detection of leakage current of cells to be erased S14, and the control of erase voltage S18, S20, S22 in accordance therewith are repeated until erase verify passes.

Figure 5:
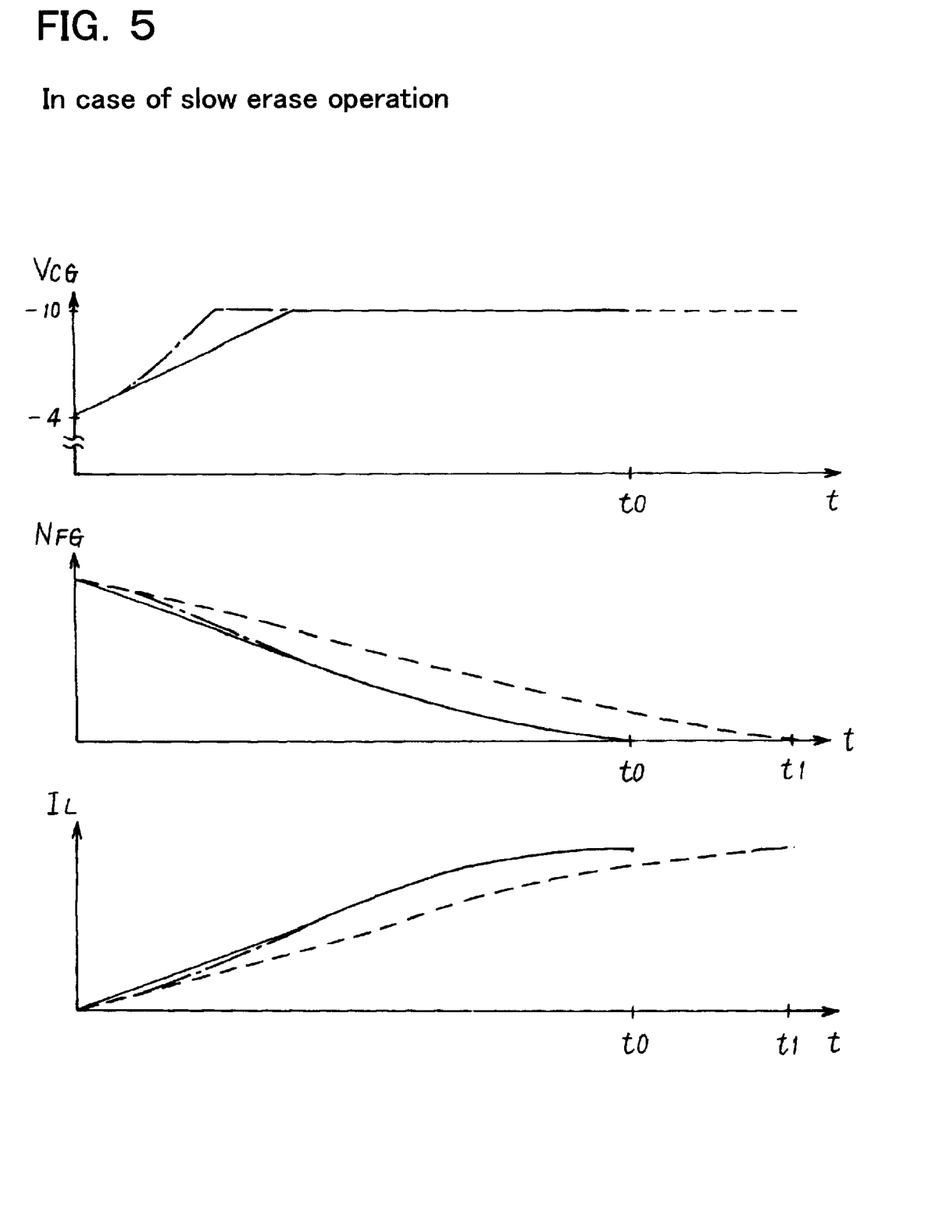
FIG. 5 is a diagram illustrating examples of erase voltage control in an erase operation.
Figure 6:
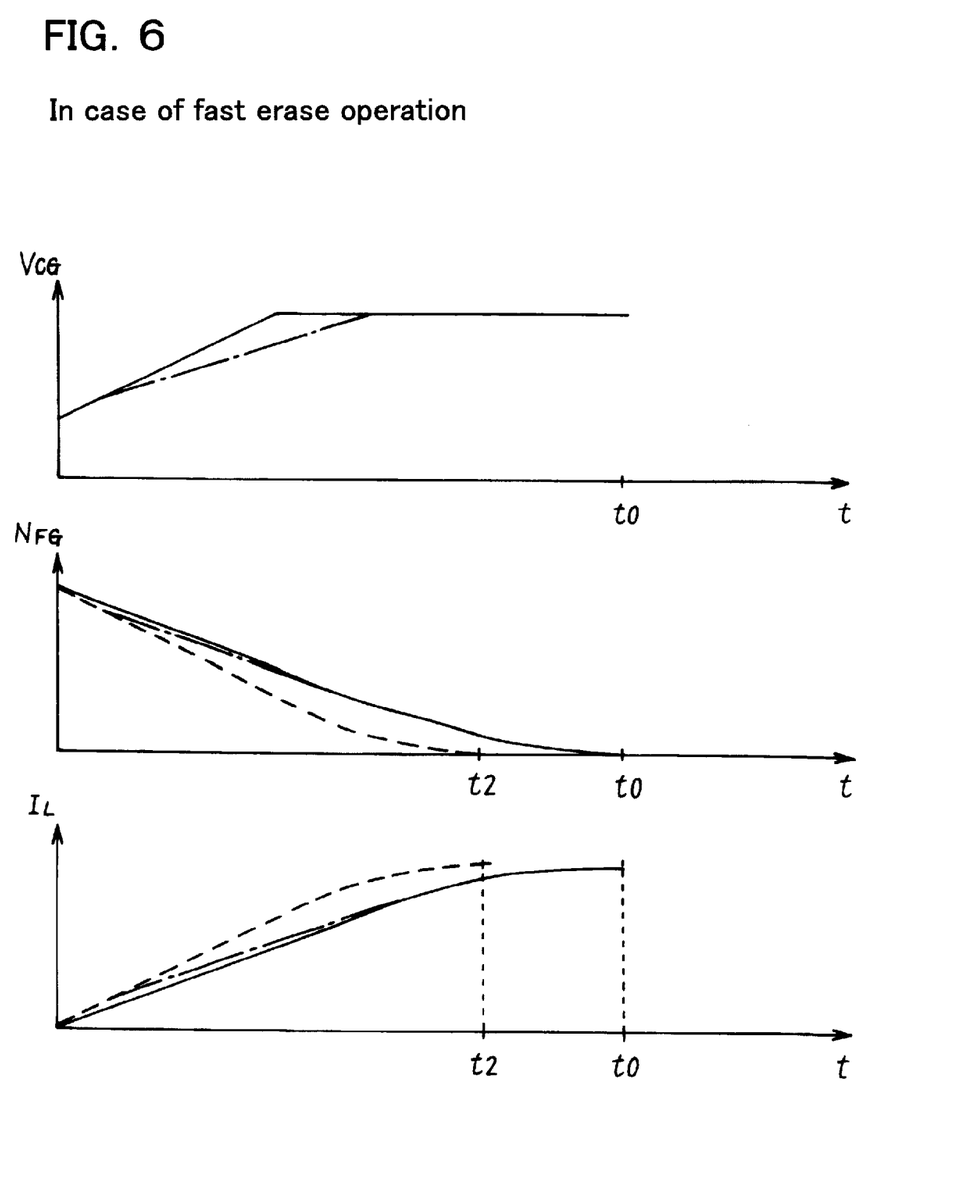
FIG. 6 is a diagram illustrating examples of erase voltage control in an erase operation.

FIG. 5 and FIG. 6 are diagrams illustrating examples of erase voltage control in erase operations. FIG. 5 shows an erase operation in the case of memory for which the erase operation is slow, and FIG. 6 shows an erase operation in a case of memory for which the erase operation is fast, respectively. In the figures, erase pulse voltage $V_{CG}$, the quantity of electrons on a floating gate $N_{FG}$, and cell leakage current IL are depicted relative to the erase time (number of erase pulses) of the horizontal axis. Furthermore, in the figures, the solid lines are the ideal erase pulse voltage, quantity of electrons on a floating gate, and cell leakage current relative to an erase time set beforehand, the broken lines are the quantity of electrons on a floating gate, and cell leakage current when the erase operation are controlled by the above-mentioned ideal erase pulse voltage curve (solid line), and, in addition, the dashed line are the quantity of electrons on a floating gate, and cell leakage current when the erase pulse voltage is controlled by the method of the embodiment.

The preset erase pulse voltage VCG is controlled by gradually raising the absolute value thereof from –6 V to –10 V in accordance with the increase of leakage current IL of a cell in line with a decrease in the quantity of electrons $N_{FG}$ on a floating gate, and thereafter, –10 V is maintained until erase verify passes.

By contrast thereto, in the case of the memory cell for which erase speed is slow of FIG. 5, when the erase pulse voltage $V_{CG}$ is controlled uniformly according to the solid line in accordance with erase time, as shown by the broken line, the reduction of the quantity of electrons $N_{FG}$ on the floating gate becomes slow, and in line therewith, the increase of cell leakage current IL also becomes slow. As a result thereof, whereas total erase time is ideally t0, the actual total erase time slows to t1. Accordingly, in the embodiment, when the cell leakage current IL is lower than the reference value indicated by the solid line, control is performed in accordance therewith so that the erase pulse voltage $V_{CG}$ becomes higher than the reference value of the solid line. That is, as shown by the dashed line, control is performed such that the rising curve of the erase pulse voltage $V_{CG}$ becomes steeper. In line therewith, a higher electric field is applied to the tunnel dielectric layer, and, even if the tunnel dielectric layer is thicker due to process fluctuations, for example, the quantity of electrons on the floating gate is reduced and cell leakage current increases in the same manner as the ideal curve. As a result thereof, erase time becomes the ideal time t0. In this case, even if the erase voltage is induced so as to increase, since the tunnel dielectric layer is thick, an excessive electric field is not applied.

Conversely, in the case of the memory cell for which erase speed is fast of FIG. 6, when the erase pulse voltage $V_{CG}$ is controlled according to the solid line, the quantity of electrons $N_{FG}$ on the floating gate declines rapidly as indicated by the broken line, and the increase in cell leakage current IL in line therewith becomes sharp. As a result thereof, an excessive electric field is continuously applied to the tunnel dielectric layer. Accordingly, in this aspect of the embodiment, when a cell leakage current IL is higher than the solid line reference value, the erase pulse voltage $V_{CG}$ is controlled so as to become lower than the solid line reference value as shown by the dashed line. In accordance therewith, the excessive electric field being applied to the tunnel dielectric layer is alleviated. In accordance with such control, the electron extraction speed resulting from the tunneling effect slows down, but erase time does not become slower than the erase time reference value t0.

As shown in FIG. 5 and FIG. 6, for the erase circuit, since there are still numerous electrons on a floating gate during the period when cell leakage current IL is small, the application of an excessive electric field to the tunnel dielectric layer can be avoided by keeping the absolute value of an erase pulse voltage $V_{CG}$ low, and during a period when cell leakage current IL becomes larger, because there are fewer electrons on the floating gate, erase can be made faster by increasing the absolute value of an erase pulse voltage $V_{CG}$. And even if erase speed fluctuates due to production irregularities, since the absolute value of an erase pulse voltage gradually rises in accordance with cell leakage current IL, erase can be performed in accordance with the optimum erase operation curve, and it is possible to prevent erase time from becoming prolonged while avoiding the applying of an excessive electric field to the tunnel dielectric layer.

In the embodiment, to avoid applying an excessive charge to the tunnel dielectric layer, the number of electrons accumulated on a floating gate are monitored, and the rising of the erase voltage is curbed when erase speed is fast as in FIG. 6, and when erase speed is slow as in FIG. 5, the rising of the erase voltage is promoted such that erase time does not become prolonged. When erase speed is slow, since the thickness of the tunnel dielectric layer is thick, an excessive electric field is not applied to the tunnel dielectric layer even if the rise of an erase voltage is speeded up. Thus, a determination is made as to whether a cell leakage current is higher or lower than a reference leakage value, which rises in accordance with erase time (number of erase pulses).

Therefore, in another control method, the control can be done similarly by monitoring the rate of change of the cell leakage current. In other words, a similar control can be performed by inducing the absolute value of an erase pulse voltage higher when the rise rate of a cell leakage current is low as shown in FIG. 5, and by inducing the absolute value of an erase pulse voltage lower when the rise rate of a cell leakage current is high as shown in FIG. 6. In the case of the control method thereof, each erase pulse voltage $V_{CG}$ is controlled according to whether the rate of change of a detected cell leakage current is higher or lower than a reference value in step S16 of the flowchart of FIG. 4.

According to the present invention as described hereinabove, it is possible to prevent erase time from becoming prolonged, and to perform an optimum erase operation without applying an excessive electric field to a tunnel dielectric layer of a memory cell having a floating gate even when production irregularities occur.

What is claimed is:

1. A semiconductor nonvolatile memory, comprising:
    a plurality of memory cells, which are provided with floating gates above a semiconductor substrate with a tunnel dielectric layer interposed therebetween, and which also have control gates; and
    an erase control circuit which detects cell leakage current by applying a leakage detecting voltage to said control gate of a memory cell to be erased, and gradually increases an erase voltage applied between said control gate and semiconductor substrate in accordance with the detected cell leakage current.

2. The semiconductor nonvolatile memory according to claim 1, wherein said erase control circuit controls said erase voltage to a first voltage when said cell leakage current is a first leakage current, and controls said erase voltage to a second voltage larger than said first voltage, when said cell leakage current is a second leakage current larger than said first leakage current.

3. The semiconductor nonvolatile memory according to claim 2, further comprising:
    a plurality of reference cells for which respective reference leakage currents differ,
    wherein said erase control circuit compares said cell leakage current with each of the reference leakage currents of said plurality of reference cells, and detects said cell leakage current in accordance with the comparative results.

4. The semiconductor nonvolatile memory according to claim 1, wherein an erase operation for applying the erase voltage to the memory cell is performed for each memory block including plural memory cells, said erase control circuit detects the sum total of cell leakage current of memory cells in the memory block to be erased, and variably controls said erase voltage in accordance with the sum total of the cell leakage current.

5. The semiconductor nonvolatile memory according to claim 1, wherein said erase control circuit maintains said erase voltage at a reference voltage value which rises in accordance with erase time, when said leakage current is the same as a reference current value which rises in accordance with erase time; said erase control circuit induces said erase voltage higher than the reference voltage value, when said cell leakage current is lower than the reference current value; and said erase control circuit induces said erase voltage lower than the reference voltage value, when said cell leakage current is higher than said reference current value.

6. The semiconductor nonvolatile memory according to claim 1, wherein said erase control circuit raises said erase voltage at a first rise rate relative to erase time when said cell leakage current has a first change rate relative to erase time; said erase control circuit raises said erase voltage at a rise rate which is lower than said first rise rate, when said cell leakage current has a change rate which is higher than said first change rate; and said erase control circuit raises said erase voltage at a rise rate which is higher than said first rise rate, when said cell leakage current has a change rate, which is lower than said first change rate.

7. The semiconductor nonvolatile memory according to claim 1, wherein said erase control circuit repeats erase verify, applying erase voltage, and detecting said cell leakage current during an erase operation until said erase verify passes.

8. A semiconductor nonvolatile memory, comprising:

a plurality of memory cells, which are provided with floating gates above a semiconductor substrate with a tunnel dielectric layer interposed therebetween, and which also have control gates; and an erase control circuit which detects cell leakage current by applying a leakage detecting voltage to said control gate of a memory cell to be erased, and controls a rise rate relative to erase time of an erase voltage applied between said control gate and semiconductor substrate in accordance with a change rate relative to the erase time of the detected cell leakage current.

9. The semiconductor nonvolatile memory according to claim 8, wherein said erase control circuit controls said erase voltage at a first rise rate when said cell leakage current has a first change rate relative to erase time, and controls said erase voltage at a second rise rate which is lower than said first rise rate, when said cell leakage current has a second change rate which is higher than said first change rate.

* * * * *